United States Patent [19]
Dirmeyer et al.

[11] Patent Number: 5,706,181
[45] Date of Patent: Jan. 6, 1998

[54] SENSOR UNIT FOR CONTROLLING AN OCCUPANT PROTECTION SYSTEM OF A MOTOR VEHICLE

[75] Inventors: Josef Dirmeyer, Bodenwöhr; Christian Plankl, Burgweinting; Robert Gruber, Regensburg; Heinrich Probst, Tegernheim, all of Germany

[73] Assignee: Siemens Aktiengesellschaft, Munich, Germany

[21] Appl. No.: 703,802

[22] Filed: Aug. 28, 1996

Related U.S. Application Data

[63] Continuation of PCT/DE95/00138 filed Jan. 02, 1995.

[30] Foreign Application Priority Data

Feb. 28, 1994 [DE] Germany .................. 44 06 499.3

[51] Int. Cl.⁶ .................................................. H05K 3/34
[52] U.S. Cl. ........................ 361/804; 361/748; 361/760; 361/765; 361/804; 200/61.45; 200/61.49; 200/61.53; 280/735; 280/734; 364/424.055; 364/426.01; 364/426.024
[58] Field of Search ........................... 361/804, 748, 361/760, 765, 784, 785, 792, 798; 200/61.45 R, 51.03, 51.04, 61.49, 61.53; 280/735, 734; 364/424.055, 426.01, 426.024

[56] References Cited

U.S. PATENT DOCUMENTS

| 5,192,838 | 3/1993 | Breed et al. ............... 200/61.45 |
| 5,322,325 | 6/1994 | Breed et al. ............... 280/735 |

FOREIGN PATENT DOCUMENTS

| 0 566 758 | 10/1993 | European Pat. Off. . |
| 2 550 145 | 2/1985 | France . |
| 39 18 407 | 12/1990 | Germany . |
| 2 245 775 | 1/1992 | United Kingdom . |

OTHER PUBLICATIONS

Patent Abstracts of Japan, vol. 13, No. 127 (P–848) [3475] Mar. 29, 1989; & JP–A–63–298165 (AISIN) Dec. 5, 1988.
Patent Abstracts of Japan, vol. 17, No. 457 (P–1597) Aug. 20, 1993; & JP–A–5107263 (Mitsubishi) Apr. 27, 1993.

Primary Examiner—Leo P. Picard
Assistant Examiner—David Foster
Attorney, Agent, or Firm—Herbert L. Lerner; Laurence A. Greenberg

[57] ABSTRACT

A sensor unit for controlling an occupant protection system has a sensor which is held in its position on a printed circuit board through the use of an elastic damping holder. The damping holder is soldered onto the printed circuit board together with the sensor. In addition, the damping holder protects the sensor during the production and mounting of the sensor unit.

6 Claims, 2 Drawing Sheets

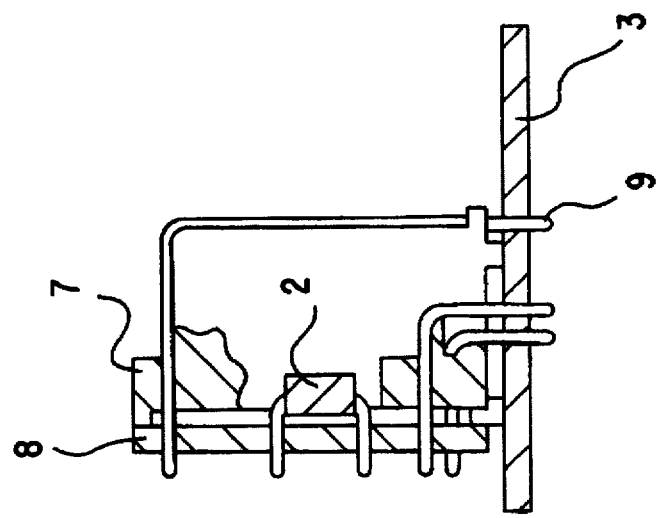
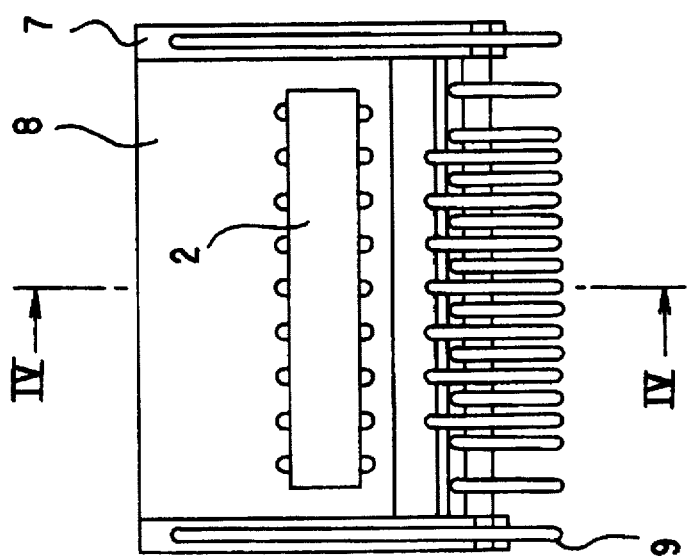
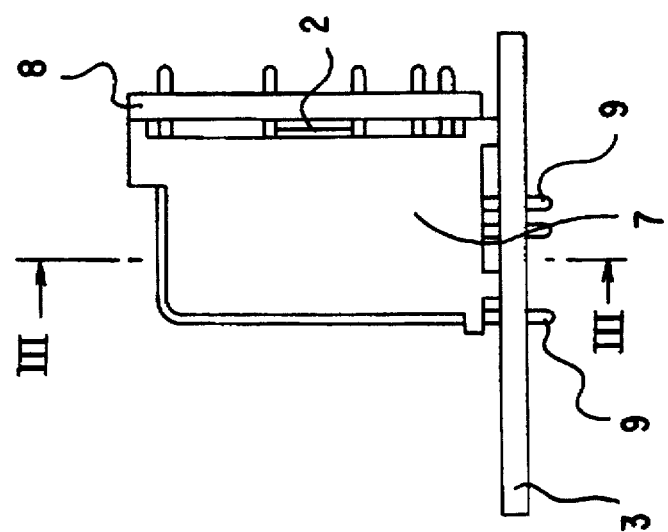

SENSOR UNIT FOR CONTROLLING AN OCCUPANT PROTECTION SYSTEM OF A MOTOR VEHICLE

CROSS-REFERENCE TO RELATED APPLICATION

This application is a Continuation of International Application Ser. No. PCT/DE95/00138, filed Feb. 2, 1995.

BACKGROUND OF THE INVENTION

1. Field of the Invention

The invention relates to a sensor unit for controlling an occupant protection system of a motor vehicle, having a printed circuit board carrying a circuit, and a sensor attached to the printed circuit board for detecting accelerations and/or decelerations.

In a sensor unit known from Published European Patent Application 0 566 758 A1, a sensor is attached to a printed circuit board. The printed circuit board is located in a housing which is partly filled up with a damping compound. The damping compound is intended to dampen mechanical vibrations which do not stem from an accident in such a way that the sensor is not inadvertently damaged.

However, such a sensor unit is very expensive to produce, since the damping compound must firstly be cured before the sensor unit can be mounted in the motor vehicle.

2. Summary of the Invention

It is accordingly an object of the invention to provide a sensor unit for controlling an occupant protection system of a motor vehicle, which overcomes the hereinaforementioned disadvantages of the heretofore-known devices of this general type, which is easy to produce, which permits mechanical vibrations as a result of an accident to be effectively transmitted to the sensor and which permits damaging vibrations which do not stem from an accident to be strongly damped.

With the foregoing and other objects in view there is provided, in accordance with the invention, a sensor unit for controlling an occupant protection system of a motor vehicle, comprising a printed circuit board; a circuit carried by the printed circuit board; a sensor attached to the printed circuit board for detecting accelerations and/or decelerations; and a damping holder soldered to the printed circuit board, the damping holder holding the sensor at a defined angle relative to the printed circuit board for damping against mechanical vibrations and protecting against mechanical effects.

Through the use of this sensor unit, mechanical vibrations as a result of an accident are effectively transmitted as far as the sensor, which detects these mechanical signals and relays them for further processing, as a result of which the occupant protection system, such as an air bag and seat-belt pretensioning system, is controlled. The damping holder protects the sensor against destruction, for example during the production and mounting of the sensor unit. Due to the geometrical construction of the damping holder, it is possible to align the sensor at the correct angle to the driving direction. Mechanical vibrations as a result of an accident are therefore detected more effectively. By soldering the damping holder on the printed circuit board, there is no need for any additional mounting step, since the other components have to be soldered on the printed circuit board in any case.

In accordance with another feature of the invention, the sensor is soldered onto a sensor printed circuit board, and the sensor printed circuit board is held by the damping holder and soldered to the printed circuit board through metal pins which are connected to the sensor printed circuit board.

In accordance with a further feature of the invention, the sensor is soldered directly onto the printed circuit board.

In accordance with an added feature of the invention, the damping holder is produced from a plastic or composite. Its damping characteristics are determined by its construction and by a suitable choice of material.

In accordance with a concomitant feature of the invention, the damping holder has a holder frame made from a metal without special damping characteristics, and a holder insert made from a material having good damping characteristics.

Other features which are considered as characteristic for the invention are set forth in the appended claims.

Although the invention is illustrated and described herein as embodied in a sensor unit for controlling an occupant protection system of a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a fragmentary, side-elevational view of a second exemplary embodiment of the sensor unit;

FIG. 3 is a sectional view of the sensor unit which is taken along a line III—III of FIG. 2, in the direction of the arrows; and FIG. 4 is a sectional view of the sensor unit which is taken along a line IV—IV of FIG. 3, in the direction of the arrows.

DESCRIPTION OF THE PREFERRED EMBODIMENTS

Figure 1:
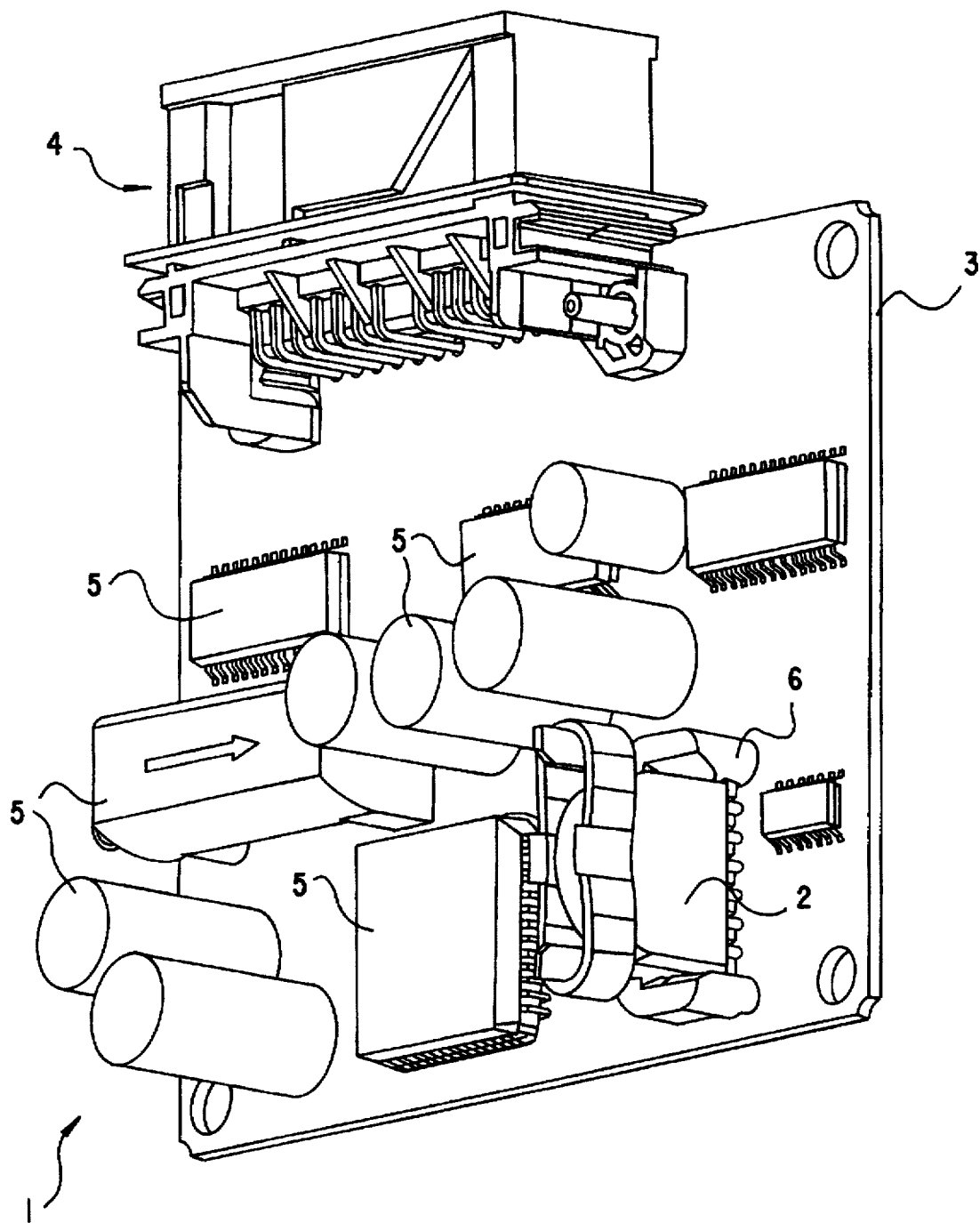
FIG. 1 is a diagrammatic, perspective view of a first exemplary embodiment of a sensor unit of the invention.

Referring now to the figures of the drawings in detail and first, particularly, to FIG. 1 thereof, there is seen a sensor unit 1 according to the invention for controlling an occupant protection system, such as for controlling an electronic trigger circuit of an air bag and seat-belt pretensioning system of a motor vehicle for example, which has a sensor 2 that can detect accelerations and/or decelerations, for example through the use of a seismic mass. The sensor 2 is connected electrically to a printed circuit board 3 carrying a circuit. In the circuit, sensor signals are evaluated and relayed through a plug-in connector 4 as an interface to the air bag or other control devices in the motor vehicle. The circuit is represented diagrammatically by diverse components 5 on the printed circuit board 3.

The sensor 2 is closely surrounded by a damping holder 6, which is likewise soldered onto the printed circuit board 3. The damping holder 6 ensures through the use of its sufficiently large holding force that the sensor 2 is not destroyed by mechanical vibrations or cannot be changed in its installed position. The damping holder 6 ensures through the use of its geometrical construction and its choice of material that it holds the sensor 2 elastically and damps mechanical vibrations. However, those vibrations which are to reach the sensor 2 as a result of an accident are effectively transmitted to the sensor 2.

A lower surface of the damping holder 6, which is not represented in FIG. 1, has metal pins through the use of which the damping holder 6 is soldered onto the printed circuit board 3. During mounting, the damping holder 6 is plugged over the sensor 2 and, together with connecting pins of the sensor 2, it is plugged into corresponding bores in the printed circuit board 3. The printed circuit board 3 can be subsequently soldered in one operation together with all of the inserted components and thus also with the sensor 2 and the damping holder 6.

The damping holder 6 ensures that the sensor 2 is disposed at a defined angular position relative to the printed circuit board 3. Thus, for example, the sensor 2 can be disposed at an angle of approximately 90° to the printed circuit board 3. After installation of the sensor unit 1 in a non-illustrated housing and mounting in the motor vehicle, it can then be ensured that the sensor 2 is located in a plane oriented at right angles to the driving direction. Consequently, the mechanical or acoustic signals triggering the air bag are detected effectively by the sensor 2 in the event of an accident. However, due to the geometrical configuration of the damping holder 6, it is also possible to achieve any other well-defined installation positions.

The damping holder 6 achieves the objective of ensuring that the sensor 2 is not inadvertently destroyed or damaged during fabrication and mounting. This condition is fulfilled if the damping holder 6 is configured in such a way that in a test before installation in the motor vehicle the sensor unit 1 survives a fall from a height of 1.20 meters onto a concrete floor without being damaged. The mechanical vibrations occurring in such a case are damped by the damping holder 6 in such a way that the sensor 2 is not damaged or shifted in its position. However, this relatively hard vibration differs from the relatively soft vibration resulting from an accident. The sensor must detect these soft vibrations and relay them to the evaluation circuit.

The damping holder 6 can be formed of plastic such as, for example, polyamide or polybutylene terephthalate, or another composite. However, the damping holder 6 can also be produced from metal. The suitable material choice and the geometry of the damping holder are determined by drop tests.

A second embodiment of the sensor unit 1 according to the invention is represented in FIGS. 2 to 4. Elements having the same construction or function bear the same reference numerals in this case as in FIG. 1.

The sensor 2 is integrated in a dual inline housing or chip housing. In order for the sensor 2 to be mounted in its position at right angles to the driving direction, it is soldered onto a sensor printed circuit board 8. The sensor printed circuit board 8 is surrounded by a damping holder 7, and the sensor 2 is therefore held in a damped manner. In this exemplary embodiment, the damping holder 7 is constructed like a housing which encloses the sensor 2 and holds the sensor printed circuit board 8 in a damped manner.

The damping holder 7 has bent metal pins 9 which project outwards through the damping holder 7 and are electrically connected both to the sensor printed circuit board 8 and to the printed circuit board 3. The sensor 2 is locked in its position and an electrical connection of the sensor 2 to the printed circuit board 3 and thereby to the circuit is produced by soldering the metal pins 9 to the printed circuit board 3.

Due to the damping holder 7, damaging mechanical vibrations are damped, but mechanical vibrations as a result of an accident are effectively transmitted to the sensor 2.

The metal pins 9 can be enclosed subsequently in the damping holder 7, or can be supplied during fabrication of the damping holder 7. It is advantageous to produce the damping holder 7 (or the damping holder 6) as an injection-molded part in which the metal pins 9 are injection-coated.

In the case of the second exemplary embodiment as well, the damping holder 7 is connected to the printed circuit board 3 through the use of flow soldering, for example. When mounting the sensor 2, the damping holder 6 or 7 is plugged onto the printed circuit board 3 together with the sensor printed circuit board 8. The damping holder 6 or 7 is constructed in such a way that no additional, provisional attachment of the sensor 2 is required before the sensor 2 is soldered with the damping holder 7 onto the printed circuit board 3.

The installation position of the sensor 2 is defined with reference to the printed circuit board 3 by the geometry of the damping holder 6, 7 and of the metal pins 9. No additional attaching elements such as screws or rivets are required due to the soldering of the damping holder 6, 7 onto the printed circuit board 3.

In a third exemplary embodiment, the sensor 2 is closely surrounded by a damping holder 6 shown in FIG. 1. The damping holder 6 has a holder frame and a holder insert, which are not represented in FIG. 1. The holder frame is made of a material without special damping properties, for example of Grilon XE 3453. The holder insert is made of a material with good damping properties, with possible materials being gathered from the description of the first exemplary embodiment. The holder frame and holder insert are geometrically configured and interconnected in such a way that the sensor 2 bears on the holder insert all sides, except for its underside or lower surface. On its lower surface, the holder frame has metal pins (which are not represented in FIG. 1) for attaching the damping holder 6 to the printed circuit board 3.

Due to this configuration of the damping holder, damaging mechanical vibrations, in particular by the holder insert, are damped, whereas mechanical vibrations as a result of an accident are effectively transmitted to the sensor 2. The material consumption for the holder insert can be kept low.

Method steps for fixing the metal pins to the holder frame as well as for fixing the damping holder 6 and the sensor 2 on the printed circuit board 3 may be gathered from the descriptions of the two preceding exemplary embodiments.

We claim:

1. A sensor unit for controlling an occupant protection system of a motor vehicle, comprising:
    a printed circuit board;
    a circuit carried by said printed circuit board;
    a sensor attached to said printed circuit board for detecting at least one of accelerations and decelerations; and
    a damping holder soldered to said printed circuit board, said damping holder holding said sensor at a defined angle relative to said printed circuit board for damping against mechanical vibrations and protecting against mechanical effects.

2. The sensor unit according to claim 1, including a sensor printed circuit board being held by said damping holder; said damping holder having a wall; said sensor being attached to said sensor printed circuit board; and rigid metal pins being connected to said sensor printed circuit board, leading through said wall of said damping holder and being soldered to said printed circuit board on which said circuit is carried, producing an electrical connection between said two printed circuit boards and producing a mechanical attachment of said damping holder to said printed circuit board on which said circuit is carried.

3. The sensor unit according to claim 1, wherein said damping holder embraces said sensor and is soldered onto said printed circuit board together with electrical connections of said sensor.

4. The sensor unit according to claim 1, wherein said damping holder is produced from plastic.

5. The sensor unit according to claim 1, wherein said damping holder is produced from metal.

6. The sensor unit according to claim 1, wherein said damping holder has a holder frame and a holder insert.

* * * * *

UNITED STATES PATENT AND TRADEMARK OFFICE
CERTIFICATE OF CORRECTION

PATENT NO. : 5,706,181
DATED : January 6, 1998
INVENTOR(S) : Josef Dirmeyer et al.

It is certified that error appears in the above-identified patent and that said Letters Patent is hereby corrected as shown below:

On title page,

Item [63] should read as follows:

Continuation of PCT/DE95/00138 filed Feb. 02, 1995

Signed and Sealed this

Twenty-fourth Day of March, 1998

Attest:

BRUCE LEHMAN

Attesting Officer

Commissioner of Patents and Trademarks